United States Patent
Every et al.

(10) Patent No.: US 10,530,917 B2
(45) Date of Patent: Jan. 7, 2020

(54) SYSTEM FOR AUTOMATING TUNING HANDS-FREE SYSTEMS

(71) Applicant: 2236008 Ontario Inc., Waterloo (CA)

(72) Inventors: Mark Robert Every, Surrey (CA); Mark William Harvey, Delta (CA); Rodney Dwight Rempel, Port Coquitlam (CA); Michael Andrew Percy, Vancouver (CA)

(73) Assignee: 2236008 Ontario Inc., Waterloo, Ontario (CA)

( * ) Notice: Subject to any disclaimer, the term of this patent is extended or adjusted under 35 U.S.C. 154(b) by 62 days.

(21) Appl. No.: 15/915,673

(22) Filed: Mar. 8, 2018

(65) Prior Publication Data

US 2019/0281149 A1    Sep. 12, 2019

(51) Int. Cl.
  *H04M 1/60* (2006.01)
  *H03G 3/20* (2006.01)
  *H04R 1/08* (2006.01)
  *H04R 29/00* (2006.01)

(52) U.S. Cl.
  CPC ............ *H04M 1/6091* (2013.01); *H03G 3/20* (2013.01); *H04R 1/08* (2013.01); *H04R 29/004* (2013.01)

(58) Field of Classification Search
  CPC ..... H04M 1/6091; H04R 1/08; H04R 29/004; H03G 3/20
  See application file for complete search history.

(56) References Cited

U.S. PATENT DOCUMENTS

| | | | |
|---|---|---|---|
| H000413 H * | 1/1988 | Lelie | 381/58 |
| 8,063,698 B2 * | 11/2011 | Howard | H03F 3/187 330/307 |
| 8,731,206 B1 * | 5/2014 | Park | H04R 29/001 381/59 |
| 8,880,058 B2 * | 11/2014 | Helm | H04B 17/104 455/425 |
| 9,092,020 B2 * | 7/2015 | Singer | G05B 13/021 |
| 9,130,525 B2 * | 9/2015 | Zielinski | H03G 5/165 |
| 9,406,310 B2 * | 8/2016 | Dennis | G01C 21/3608 |

(Continued)

FOREIGN PATENT DOCUMENTS

EP    1883213 A1    1/2008

OTHER PUBLICATIONS

EPO, Extended European Search Report relating to EP application No. 19161577.2, dated Jun. 19, 2019.

*Primary Examiner* — Lewis G West
(74) *Attorney, Agent, or Firm* — Rowand LLP

(57) ABSTRACT

A system and method automates the tuning of one or more hands-free library parameters. The system and method plays one or more test signals that vary in frequency and in amplitude out of a hands-free system under test or the hands-free tuning system and records the responses of a hands-free tuning system or hands-free tuning system at a microphone of the hands-free tuning system and a microphone of the hands-free system under test. The system and method measures the sound generation and sound pickup characteristics of the hands-free system under test or the hands-free system with respect to the one or more of the test signals and one or more of the microphone signals. The system and method calculates tunable parameters. The system and method updates a hands-free system library with the calculated plurality of tunable parameters.

12 Claims, 5 Drawing Sheets

(56) References Cited

U.S. PATENT DOCUMENTS

| | | | | |
|---|---|---|---|---|
| 9,495,951 B2* | 11/2016 | Miet | ............... | G10K 11/178 |
| 9,510,067 B2* | 11/2016 | Valeri | ............... | G08C 23/02 |
| 9,591,411 B2* | 3/2017 | Jensen | ............... | H04R 25/30 |
| 9,813,536 B2* | 11/2017 | Abramo | ............... | H04W 76/14 |
| 2003/0112088 A1* | 6/2003 | Bizjak | ............... | H03G 3/3089 |
| | | | | 333/14 |
| 2007/0281648 A1* | 12/2007 | Rokusek | ............... | H04M 1/6041 |
| | | | | 455/206 |
| 2009/0060166 A1 | 3/2009 | Schmidt | | |
| 2011/0064232 A1* | 3/2011 | Ruwisch | ............... | H04M 1/24 |
| | | | | 381/59 |
| 2012/0128134 A1* | 5/2012 | Pappas | ............... | H04M 3/2236 |
| | | | | 379/1.01 |
| 2012/0278041 A1 | 11/2012 | Haulick et al. | | |
| 2013/0142360 A1* | 6/2013 | Potard | ............... | H03G 9/18 |
| | | | | 381/98 |
| 2014/0278439 A1* | 9/2014 | Rajagopal | ............... | G10L 15/01 |
| | | | | 704/275 |
| 2015/0156299 A1* | 6/2015 | Abramo | ............... | H04W 76/14 |
| | | | | 455/41.2 |
| 2015/0334215 A1* | 11/2015 | Zad-Issa | ............... | H04M 1/24 |
| | | | | 455/418 |
| 2016/0119715 A1 | 4/2016 | Ozcan | | |

\* cited by examiner

SYSTEM FOR AUTOMATING TUNING HANDS-FREE SYSTEMS

BACKGROUND OF THE DISCLOSURE

1. Technical Field

This disclosure relates to calibrations and in particular, to systems and methods that automatically tune hands-free systems.

2. Related Art

Original equipment manufacturers (OEMs) invest time and money to tune hands-free systems. Some OEMs tune dozens of hands-free system parameters to ensure their systems operate effectively. These hands-free parameters are manually tuned by experts, which can cause significant delays during production. Once tuning is completed, standardized tests are run to validate system performance. The validation can cost several days, and if a test fails, more time to correct the failures and rerun the tests.

Due to the considerable time and expense invested in tuning hands-free parameters and the inconvenience in using experts, some systems go into production not validated or worse out of tune. To address this problem, this disclosure generates and automates a hands-free tuning system and validation process. The systems and methods are economical, efficient, and in some instances, automatically tune hands-free systems' parameters.

BRIEF DESCRIPTION OF THE DRAWINGS

The disclosure is better understood with reference to the following drawings and description. The elements in the figures are not necessarily to scale, emphasis instead being placed upon illustrating the principles of the disclosure. Moreover, in the figures, like referenced numerals designate corresponding parts throughout the different views.

DETAILED DESCRIPTION

Hands-free telephone systems are becoming more common in vehicles. There are built-in hands-free-systems, after-market hands-free vehicle kits, and wireless devices. These systems may include automated tuning software, loudspeakers to render audio, one or more distributed microphones, microphone arrays, or directional microphones that pick up sound. The audio may lie within a range that is perceptible to the human ear—from about 20 hertz through about 20,000 hertz. The automated tuning software may be part of an application or a software module that provides a discrete or combinations of calibrations, system integrity checks, audio screenings, parameter adjustments, and/or system validations. The parameter adjustments may remediate echo, assure echo canceler stability, equalize far-end and/or near end signals, adjust loudness in receive and send channels, control sensitivity in or across one or more aural frequencies, ensure speech quality and stability, monitor and remediate background noise, idle channel noise, and/or distortion (in the receive and the send channels), etc. The automated tuning software may control or process some (a subset of) or all of these conditions.

An automated tuning and/or validating method and/or system (sometimes referred to as an automated hands-free tuning system or automated hands-free tuning systems), screens hands-free systems, optimizes hands-free system parameters, and/or validates hands-free system's sound generation and sound pick-up. The automated hands-free tuning systems often function in a vehicle and may update information at the same rate data is received enabling the automated hands-free tuning systems to program a hands-free system in response to any audio event on the fly as the event occurs. The information may be stored in a memory and processed in real-time making hands-free parameter adjustments until the hands-free system meets one or more standards (e.g., telecommunication standards). The hands-free parameters may be adjusted and evaluated iteratively by repeated adjustments and test sequences until a desired condition prevails. This sequential repetition ensures validations are achieved quickly and efficiently. Because the automated hands-free tuning systems can operate under any conditions, integrity tests, calibrations, screening, adjustments, and/or validations may occur in real-time during real or simulated vehicle operating conditions. A vehicle traveling at different speeds may subject a hands-free system to various wind noises. A vehicle traveling through a variety of weather conditions may subject a hands-free system to various weather conditions such rain and thunderstorms and their accompanying noises. A vehicle traveling in a cold climate may subject the hands-free system to other variable and steady-state noises such as the noise introduced by a continuous or variable fan defrost settings that blows air at a microphone.

Figure 1:
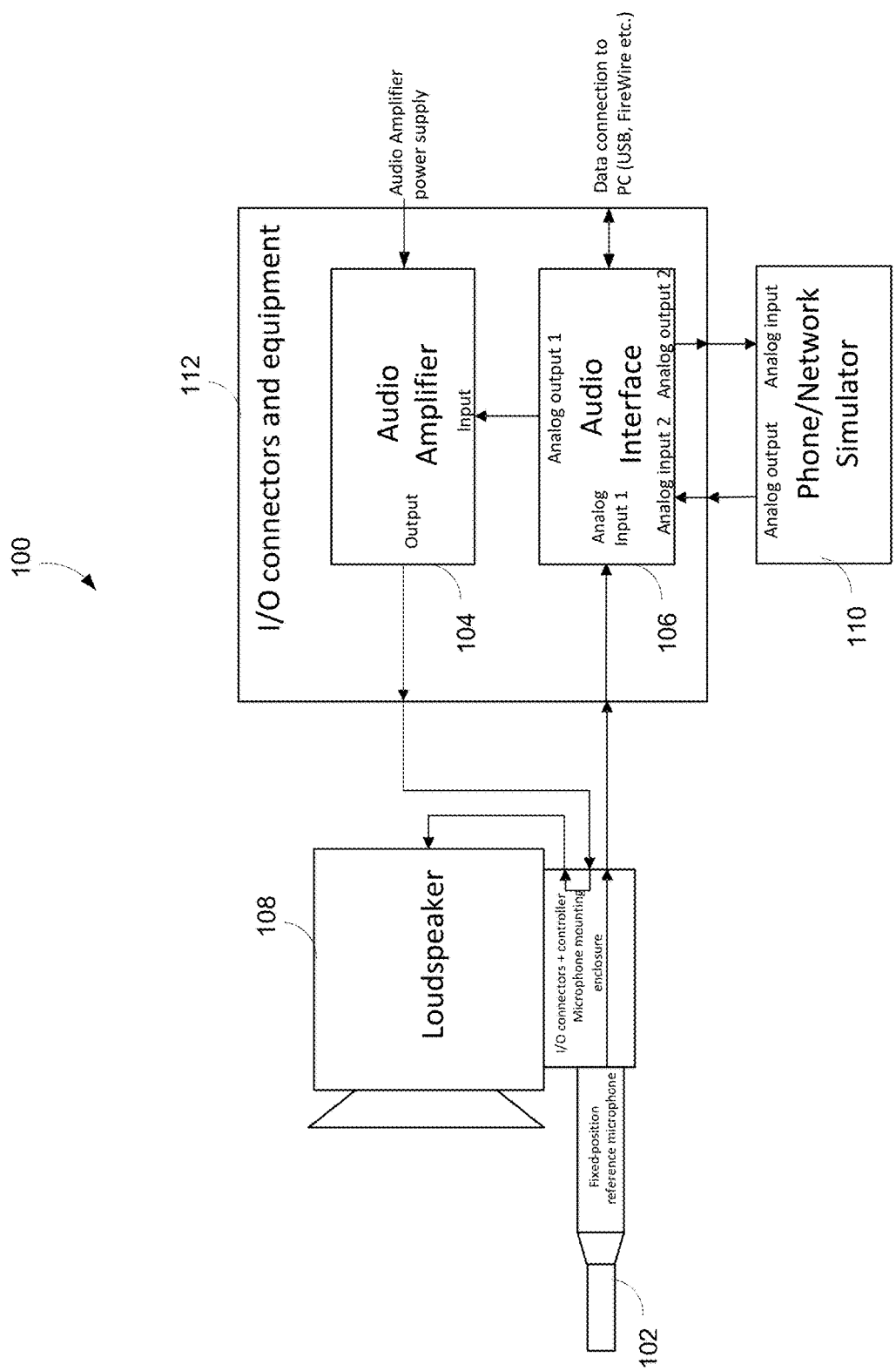
FIG. 1 a block diagram of a hardware audio device (HAD) for tuning hands-free-systems.

The automated hands-free tuning systems includes a hardware audio device (HAD) 100 and a software module—an automated tuning software (ATS) module 202. The term software module generally refers to a collection of programming routines and data structures that performs a particular task and comprises two parts: an interface and source code. In FIG. 1, the HAD 100 includes an omnidirectional microphone 102 that picks up sound equally around the microphone 102 and records sounds from many directions at a high sensitivity (e.g., such as 300 mV/Pa±3 dB at about 1 kHz). The omnidirectional microphone 102 couples to an audio interface 106. The microphone 102 and audio interface 106 are calibrated such that a given sound pressure level (SPL) at the microphone will result in a predictable digital signal level output from the audio interface. The loudspeaker 108 is coupled to an audio amplifier 104, which is in turn driven by the audio interface 106. The loudspeaker 108, audio amplifier 104 and audio interface 106 are calibrated so that a given digital signal level input to the audio interface will result in a predictable sound pressure level (SPL) reproduced by the loudspeaker. An optional telephone/network simulator 110 is connected to the audio interface 106. The audio interface 106 enables recording from the microphone 102 and telephone/network simulator 110, and playback of audio to the loudspeaker 108 and telephone/network simulator 110, via the remote controller 206. The orientation of the omnidirectional microphone 102 is fixed with respect to the loudspeaker 108.

The audio interface 106 couples an external or remote controller 206 through a physical or a virtual bus. The bus is a universal serial bus, a high-speed communication bus such as FireWire, for example, or a serial or a parallel bus that enables audio signals to be generated and/or recorded locally or remotely. The optional telephone/network simulator 110 is paired to the device-under-test (DUT) 206 through a short-range wireless network (e.g., a wireless network like Bluetooth), a long-range wireless network, or a physical network. The optional telephone/network simulator 110 simulates a telephone call or a wireless connection, and it may provide/receive audio data to/from the audio interface 106 through analog signals (using digital to analog conversion, and analog to digital conversion) and/or through digital signals. The signals may include a recording and/or playback of one or more uplink and/or downlink signals. Downlink signals to the DUT 206 may include pre-recordings, speech or speech-like signals (e.g., artificial speech), noise such as background noise, standard test signals, and/or other audio processing sounds. Uplink signals may include the processed microphone signal from the DUT 206.

Figure 3:
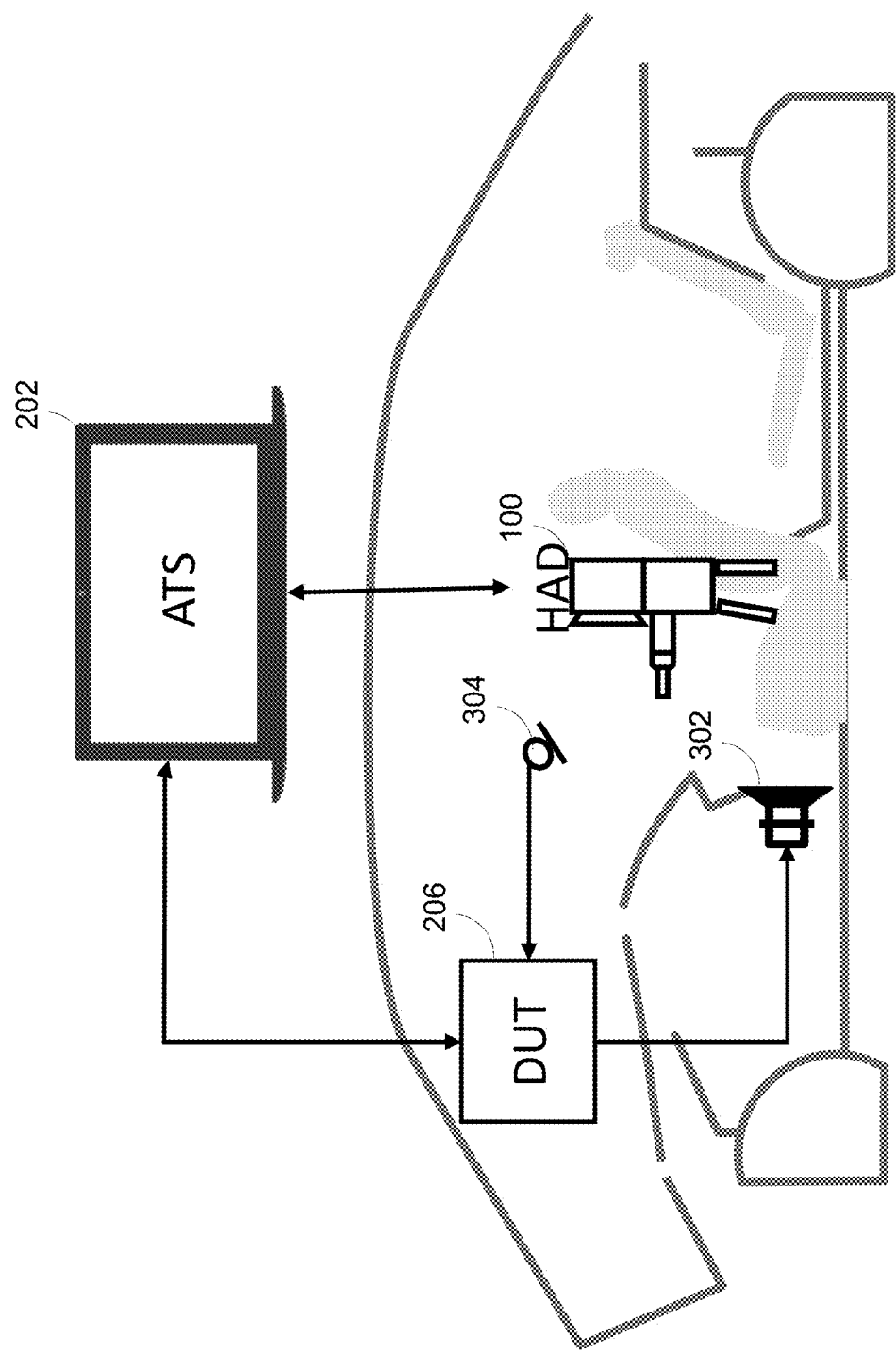
FIG. 3 is a hands-free-system under calibration.

The HAD 100 may be a standalone device (e.g., a modular component) as shown in FIG. 3 or a unitary part of a vehicle, making the hands-free system in the vehicle self-tuning. In some applications, the modular HAD 100 is positioned in a seat of a vehicle cabin, for example the driver's seat. The omnidirectional microphone 102 may be positioned at approximately the mouth-reference-point (MRP). The MRP is a few centimeters (e.g. 25 cm) in front of the approximate position of the passenger's mouth when seated. The HAD's loudspeaker 108 may be front facing positioned at approximately the height of the passenger's head when seated. The loudspeaker's 108 position may be above a vehicle's lower loudspeakers that maybe positioned in the footwell of the driver 302 as shown in FIG. 3 and/or the passenger compartments.

Figure 2:
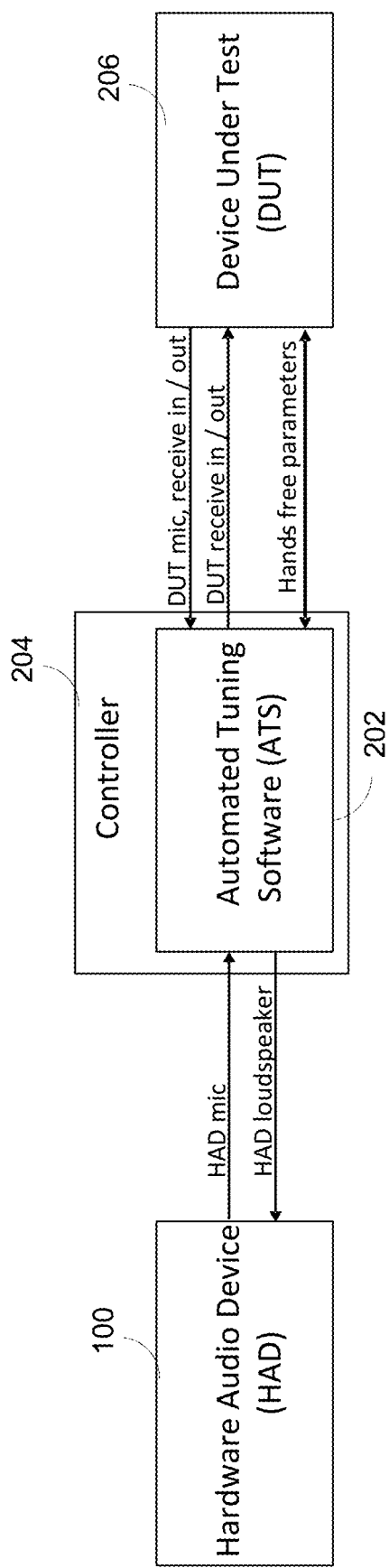
FIG. 2 is a system that automatically tunes hands-free-systems.

The ATS module 202 connects to both the HAD 100 and the device-under-test (DUT) as shown in FIG. 2. While the connection from the HAD 100 to the DUT 206 may be an Ethernet connection, alternate connections use wireless networks. In FIG. 2, the DUT 206 is a voice processing system or an audio system that may work with other systems that generate sound and/or picks up sound while remaining useable and reusable to other systems. These systems, like entertainment systems, run hands-free libraries. An exemplary hands-free library supports both narrow and wideband speech, at an exemplary sampling rate of about 8 kHz and about 16 kHz, respectively, for example. The exemplary hands-free library may also support Wideband Plus, Super Wideband or full-band applications, with a wider range of audio frequencies, at a higher sampling rates (e.g., at about 24 kHz or greater). Each of the hands-free libraries enable the hands-free systems to address the audio and/or voice processing requirements of the latest smartphone connectivity protocols.

In operation, the ATS module 202 controls many audio processing screenings, adjustments, and validations. The validations may execute customized tests or standards based tests such as those described in the telecommunication standardized sector tests. The telecommunication standardization sector of ITU tests may include: ITU-T P.1100, ITU-T P.1110, ITU-T P.1120, and ITU-T P.1140 tests, etc., each of which are incorporated by reference. Other tests measure other conditions. These conditions may include equalization, echo canceler stability, echo cancellation performance in single-talk and double-talk, loudness in receive and send channels, sensitivity in one or more aural frequencies, speech quality and speech stability, noise reduction, and/or distortion of speech components (in the receive and the send channels), etc.

Figure 4:
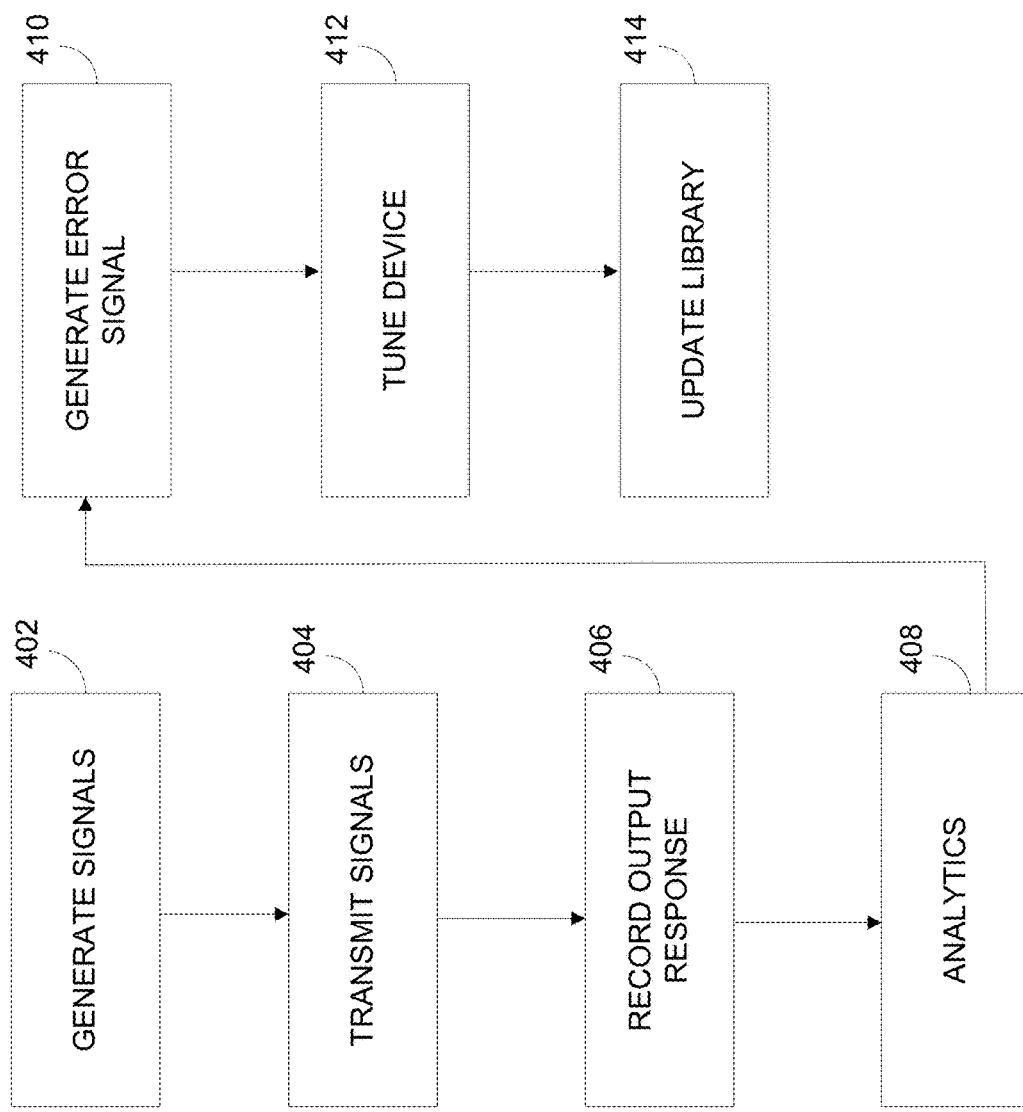
FIG. 4 is a process flow of an exemplary test.

In an exemplary receive distortion test, a far end speech or artificial test signal is created by ATS module 202 at 402 in FIG. 4. In 404, the signal is injected into the downlink path of the DUT, either through the telephone/network simulator 110 or directly from the controller 204 to the DUT 206, and played into the vehicle cabin through the vehicle's loudspeakers 302. The far end speech or artificial test signal may vary in frequency and in amplitude. A microphone input of the DUT 206 and the omnidirectional microphone 102 capture the response of the speech or artificial test signal, and the ATS module 202 records the response in memory at 406. The frequency components of the response are then extracted from the captured signals and compared to the far end speech or artificial test signal by the ATS module 202 at 408 to calculate a total harmonic distortion measurement and/or a total harmonic distortion plus noise measurement. Based on a comparison to a scalar distortion threshold value, the ATS module 202 assigns a distortion value at 410. If the distortion value exceeds the scalar distortion threshold, the ATS module 202 may generate a control signal or one or more hands-free speech parameters that adjust speech parameters in the hands-free-library at 412. The adjustments may compress or limit speech parameters of the DUT 206 to meet a compliance standard or achieve a passing result. For example, the parameters may include multiband limiter parameters related to a plurality of cutoff frequencies and thresholds. The adjusted speech parameters may update the hands-free library at 414 (now tuned) in a configuration file of the DUT 206 like each of the parameters described herein.

In an exemplary tuning of a send equalization curve stored in the hands-free library, a known test signal is injected from the HAD loudspeaker 108 into the vehicle cabin. The known test signal may vary in frequency and in amplitude. The ATS measures the response at the DUT microphone or through an uplink signal at the network interface. The ATS module 202 calculates the frequency response and compares the frequency response to a target frequency response (e.g., such as the send frequency response described in ITU-T P.1100 or ITU-T P.1110). The difference between the measured response and the target frequency response is then processed and a control signal or one or more hands-free equalization curve parameters generated that adjust the send equalization curve (e.g., equalization in the transmission channel) in the hands-free library. The result may be stored and updated in the hands-free library (now tuned) in a configuration file of the DUT 206.

In an exemplary tuning of a receive equalization curve stored in the hands-free library, a known test signal is injected into the downlink path of the DUT 206 either through the telephone/network simulator 110 or directly from the controller 204 to the DUT 206, and played into the vehicle cabin through the vehicle's loudspeakers 302. The known test signal may vary in frequency and in amplitude. The ATS module 202 measures the response at the omnidirectional microphone 102. The ATS module 202 calculates the frequency response and compares the frequency response to a target frequency response (e.g., such as the receive frequency response described in ITU-T P.1100 or ITU-T P.1110). The difference between the measured and the target frequency response is then processed and a control signal or one or more hands-free equalization curve parameters generated that adjust and updates the receive equalization curve (e.g., equalization in the receiving channel) in the hands-free library. The results are stored in the hands-free library (now tuned) in the configuration file of the DUT 206.

In an exemplary tuning of send automatic gain control (AGC) parameters and/or fixed gain parameter stored in the hands-free library, a known test signal is injected from the HAD loudspeaker 108 into the vehicle cabin. The known test signal may vary in frequency and in amplitude. The ATS module 202 measures the audio response at the DUT microphone 304 or through an uplink signal at the network interface. The ATS module 202 calculates one or more levels and compares the levels to target levels (e.g., such as the send loudness levels described in ITU-T P.1100 or ITU-T P.1110). The difference between the measured loudness (e.g., AGC) and the target loudness levels is then processed and a control signal or one or more hands-free send AGC parameters adjust the variable or fixed gain in the hands-free library. The result (e.g., a loudness reduction or increase in the transmission channel) updates the hands-free library (now tuned) stored in the configuration file of the DUT 206.

In an exemplary tuning of receive automatic gain control (AGC) parameters and/or fixed gain parameter stored in the hands-free library, a known test signal is injected into the downlink path of the DUT 206 and played out of the vehicle's loudspeakers 302 into the vehicle cabin. The known test signal may vary in frequency and in amplitude. The ATS module 202 measures the audio response at the omnidirectional microphone 102. The ATS module 202 calculates one or more levels and compares the levels to target levels (e.g., such as the receive loudness levels described in ITU-T P.1100 or ITU-T P.1110). The difference between the measured loudness (e.g., AGC) and the target loudness levels is then processed and a control signal or one or more hands-free receive AGC parameters adjust the variable or fixed gain in the hands-free library. The result (e.g., a loudness reduction or increase in the receiving channel) updates the hands-free library (now tuned) stored in the configuration file of the DUT 206.

There are many other tests executed by the automated hands-free tuning systems that screen, adjust, and/or validate sound generation and/or sound pickup characteristics in a vehicle. Some or all of the automated hands-free tuning systems generate one or more known test signals that comprise pure tones, sweeps and noise bursts of varying amplitude and/or frequency to adjust, and/or validate an entire DUT 206 system or subsystems of the DUT system 206 (not the entire system). Software updates to the controller 204 of the automated hands-free tuning systems can add new tests or tuning parameters to the automated hands-free tuning systems too. Using a send-and-play format these tests or new functionality may be deployed in the field without modifying the automated hands-free tuning system's hardware. The software configures itself automatically to the hardware to generate the send-and-play architecture that allows different tests and functionality to be added or removed on the fly to the automated hands-free tuning systems even while the vehicle is in motion. Further, each of the automated hands-free tuning systems may generate, inject, and/or measure signals in the network at one, two, or three different test points. These points include: 1) at the HAD loudspeaker 108 and/or microphone 102; and/or 2) at the optional phone/network simulator 110 connected to the HAD 100 (e.g., at the wireless uplink and/or downlink); and/or 3) at the inputs and outputs of the hands-free library in both the uplink/send and downlink/receive directions. Further, the ATS module 202 may forward some or all of the tuning, calibration, and diagnostic data, including data that was recorded and calculated automatically to a local or remote memory, remote vehicle, or remote site or system.

To ensure accuracy, some HADs 100 and controllers 204 are self-calibrating. In a self-calibrating operating state, the HAD loudspeaker 108 converts a test signal into audible sound and injects the sound into a test enclosure while the HAD microphone 102 records the signal within the enclosure. In some applications, the test enclosure is a vehicle cabin. The ATS module 202 analyzes the recorded signal and calculates an adjusted equalization curve and/or gain adjustments. The adjustments are the stored in memory and executed by the HAD 100 to tailor the sound generated by and/or received by the automated hands-free tuning systems to the desired acoustic levels of a selected test. The self-calibration assures that the automated hands-free tuning systems has a proper equalization, a proper SPL, and a proper microphone sensitivity or characteristic at one or more desired reference points.

Some automated hands-free tuning systems also verify hands-free system integrity before the hands-free system is screened, adjusted, and/or validated. These automated hands-free tuning systems detect one or more: microphone failures, noise floor levels, temporal aliasing, loudspeaker failures, misrouting of signals, audio packet losses, network failures, and/or latency issues. The system integrity tests generate diagnostic information that is processed to ensure the hands-free systems are secure, up-to-date, and free from problems, and is also used to make system improvements. Exemplary tests may measure latency, audio clipping and saturation, microphone performance, and/or harmonic distortion.

An exemplary latency test measures the delay or latency between two or more signals that are compared against acceptable latency measures. Acceptable ranges of some hands-free systems are less than a 70 ms delay between a receive/downlink signal at the input to the hands-free library and a reflection (e.g., an echo) at the microphone/uplink output of the hands-free library. Another acceptable range is less than a 100 ms send delay between an audible signal generated by the HAD loudspeaker 108 and the uplink signal at the network interface. Yet another acceptable range is less than a 100 ms receive delay between a downlink signal at the network interface and the received signal converted into an electric signal at the HAD microphone 102. Another acceptable range is less than 170 ms for the sum of the aforementioned send and receive delays.

An exemplary detection of clipping and/or saturation test measures the level of clipping and/or saturation of DUT microphone signal when playing a known test signal from the HAD loudspeaker 108. The ATS module 202 compares the measured clipping and/or saturation to acceptable thresholds. Based on those comparisons, the ATS module 202 generates a clipping and/or saturation signal that indicates the existence and/or status of the clipping and/or saturation condition.

Other exemplary tests, compare noise floor during periods of silence to acceptable thresholds, detect aliasing and/or measure harmonic distortion at the DUT microphone 304 while playing a known test signal at the HAD loudspeaker 108. Another exemplary test monitors aliasing and/or measures harmonic distortion when injecting a known test signal at a DUT output. The aliasing and/or harmonic distortion tests measure the response at the HAD 102 or DUT microphone 304. The ATS module 202 compares the measurement to acceptable thresholds. Based on these comparisons, the ATS module 202 generates an aliasing and/or harmonic distortion error signal that indicates the existence and/or status of the aliasing and/or harmonic condition.

Figure 5:
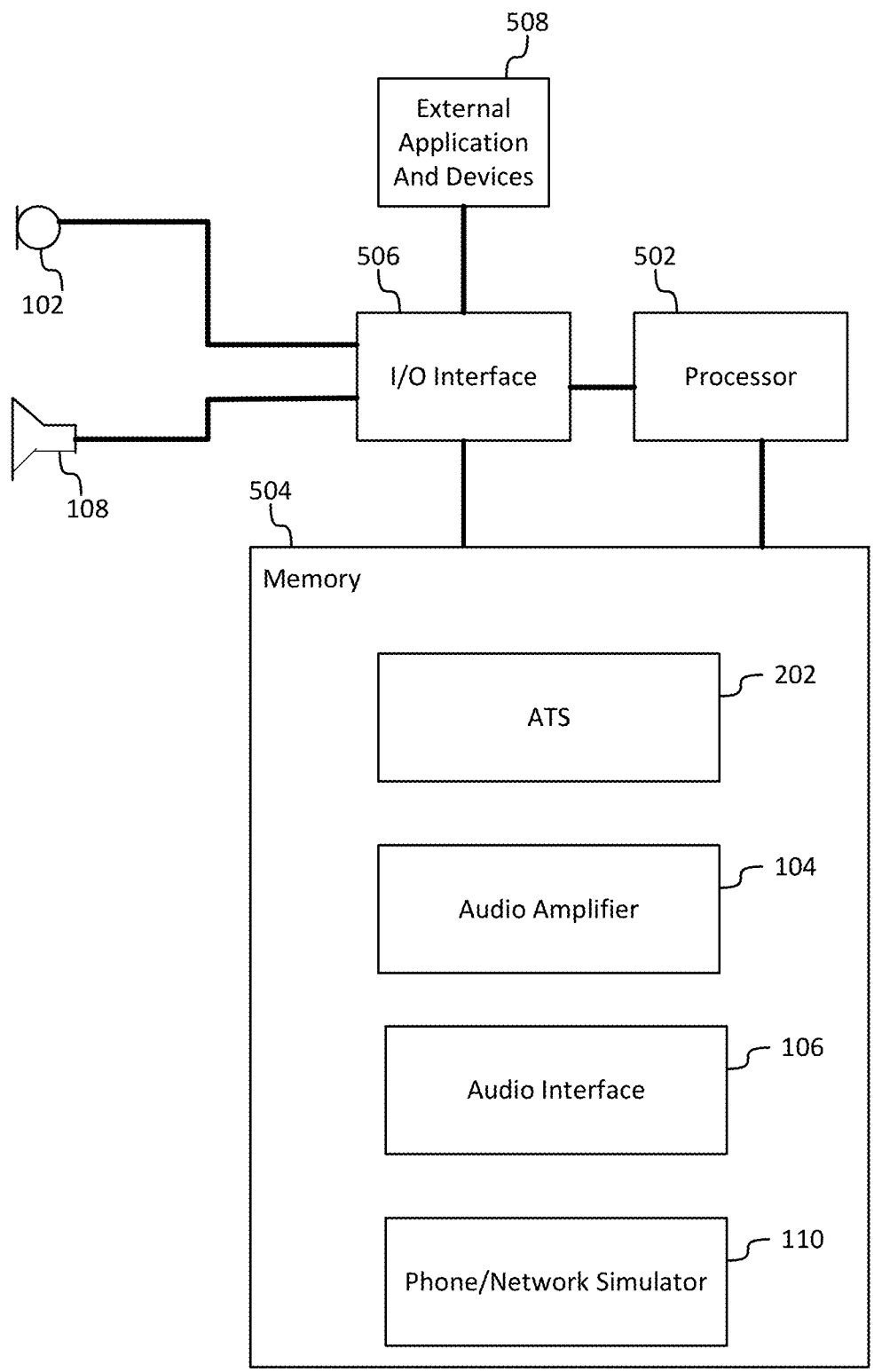
FIG. 5 is a vehicle with an automated tuning system.

FIG. 5 is a block diagram of an automated hands-free tuning system. The system comprises a processor 502, a non-transitory media such as a memory 504 (the contents of which are accessible by the processor 502) an I/O interface 506, a microphone 102 and a loudspeaker 108. The I/O interface 506 connects devices and local and/or remote applications such as, for example, one or more additional microphones, audio transducers, loudspeakers, phone/network simulators, and/or transceivers (collectively referred to as 508). The memory 504 may store instructions which when executed by the processor 502 that causes the system to render some or all of the functionality associated with calibration of the automated hands-free tuning systems and screening, adjustment, validation, and/or integrity testing of hands-free systems as described herein. For example, the memory 504 may store instructions which when executed by the processor 502 causes the system to render the functionality associated with the audio amplifier 104, the audio interface 106, the optional phone/network simulator 110 and the ATS module 202.

The processors 502 may comprise a single processor or multiple processors that may be disposed on a single chip, on multiple devices, or distributed over more than one system. The processors 502 may be hardware that executes computer executable instructions or computer code embodied in the memory 504 or in other memory to perform one or more features of the systems described herein. The processor 502 may include a central processing unit (CPU), a graphics processing unit (GPU), an application specific integrated circuit (ASIC), a digital signal processor (DSP), a field programmable gate array (FPGA), a digital circuit, an analog circuit, a microcontroller, any other type of processor, or any combination thereof.

The memory 504 and/or storage disclosed may retain an ordered listing of executable instructions for implementing the functions described above. The machine-readable medium may selectively be, but not limited to, an electronic, a magnetic, an optical, an electromagnetic, an infrared, or a semiconductor medium. A non-exhaustive list of examples of a machine-readable medium includes: a portable magnetic or optical disk, a volatile memory, such as a Random Access Memory (RAM), a Read-Only Memory (ROM), an Erasable Programmable Read-Only Memory (EPROM or Flash memory), or a database management system. The memory 504 may comprise a single device or multiple devices that may be disposed on one or more dedicated memory devices or on a processor or other similar device. When functions or steps are said to be "responsive to" or occur "in response to" a function or a process, the device functions or steps necessarily occur as a result of the function or message. It is not sufficient that a function or act merely follow or occur subsequent to another.

The memory 504 may also store a non-transitory computer code, executable by processor 502. The computer code may be written in any computer language, such as C, C++, assembly language, channel program code, and/or any combination of computer languages. The memory 504 may store information in data structures including, for example sound generation and sound pick-up parameters.

The functions, acts, or tasks illustrated in the figures or described may be executed in response to one or more sets of logic or instructions stored in or on non-transitory computer readable media as well. The functions, acts or tasks are independent of the particular type of instructions set, storage media, processor or processing strategy and may be performed by software, hardware, integrated circuits, firmware, micro code and the like, operating alone or in combination. In one embodiment, the instructions are stored on a removable media device for reading by local or remote systems. In other embodiments, the logic or instructions are stored in a remote location for transfer through a network or over wireless or tangible communication lines. In yet other embodiments, the logic or instructions may be stored within a given computer such as, for example, a CPU.

The systems automatically tunes hands-free systems via their parameters without applying subjective testing criteria. The system tunes all or some of the hands-free systems consistently across many different vehicle models. The system can be a unitary part of a vehicle (making the system self-tuning and enabling the vehicle to optimize its own internal parameters on the fly at any time) or a standalone or modular system positioned in a vehicle to adjust sound generation and sound pickup. A vehicle may include without limitation, a car, bus, truck, tractor, motorcycle, bicycle, tricycle, quadricycle, or other cycle, ship, submarine, boat or other watercraft, helicopter, drone, airplane or other aircraft, train, tram or other railed vehicle, spaceplane or other spacecraft, and any other type of vehicle whether currently existing or after-arising this disclosure. In other words, it comprises a device or structure for transporting persons or things. The system is easy and quickly adapted to different vehicle and cabin types and different acoustic environments configurations.

The subject-matter of the disclosure may also relate, among others, to the following aspects:

1. A method that automates the tuning of a hands-free system comprising:

playing one or more test signals that vary in frequency and in amplitude out of a hands-free system under test;

recording the responses of a hands-free tuning system at a microphone of the hands-free tuning system or a microphone of the hands-free system under test;

measuring the sound generation and sound pickup characteristics of the hands-free system under test with respect to the one or more of the test signals and one or more of the microphone signals;

calculating a plurality of tunable parameters of the hands-free system under test; and updating a hands-free system library with the calculated plurality of tunable parameters; wherein the hands-free library is remote from the hands-free tuning system but utilized by the hands-free tuning system during operation.

2. The method of clause 1 wherein the playing of one or more test signals that vary in frequency and in amplitude out of a hands-free system under test comprises injecting these signals into a telephone/network simulator.

3. The method of any of clauses 1 to 2 further comprising tuning a multiband compressor with one or more of the plurality of tunable parameters.

4. The method of any of clauses 1 to 3 further comprising tuning an automatic gain control of a receiving channel with one or more of the plurality of tunable parameters 5. The method of any of clauses 1 to 4 further comprising tuning an equalization curve of a receiving channel with one or more of the plurality of tunable parameters.

6. The method of any of clauses 1 to 5 wherein the calculating of the plurality of tunable parameters of the hands-free system under test occurs at the same rate as the process measures the sound generation and sound pickup characteristics of the hands-free system.

7. The method of any of clauses 1 to 6 wherein the updating a hands-free system library with the calculated plurality of tunable parameters occurs at the same rate as the process measures the sound generation and sound pickup characteristics of the hands-free system.

8. The method of any of clauses 1 to 6 wherein the act of measuring the sound generation and sound pickup characteristics of the hands-free system under test occurs in response to a software update of the hands-free tuning system.

9. The method of any of clauses 1 to 8 further comprising validating the hands-free system under test against an industry standard after the hands-free system library is updated.

10. The method of any of clauses 1 to 9 further comprising comparing the selected sound generation and sound pickup characteristics of the hands-free system under test to a predetermined threshold and generating a status signal that indicates a clipping condition, a saturation condition, an aliasing condition, a distortion condition, a noise floor condition, a latency condition or a packet dropout condition.

11. The method of any of clauses 1 to 10 wherein the acts of: playing one or more test signals, recording the responses of the hands-free tuning system; measuring the sound generation and sound pickup characteristics of the hands-free system under test; calculating the plurality of tunable parameters of the hands-free system under test; and updating the hands-free system library is a repeated until the hands-free system under test reaches an industry standard operating condition.

12. A method that automates the tuning of a hands-free system comprising:

playing one or more test signals that vary in frequency and in amplitude out of a hands-free tuning system;

recording the responses of the hands-free tuning system at a microphone of the hands-free tuning system or a microphone of the hands-free system under test;

measuring the sound generation and sound pickup characteristics of the hands-free system under test with respect to the one or more of the test signals and one or more of the microphone signals;

calculating a plurality of tunable parameters of the hands-free system under test; and updating a hands-free system library with the calculated plurality of tunable parameters; wherein the hands-free library is remote from the hands-free tuning system but utilized by the hands-free tuning system during operation.

13. The method of clause 12 wherein the recording the responses of a hands-free tuning system at a microphone of the hands-free tuning system comprises recording the responses at a telephone/network simulator.

14. The method of any of clauses 12 to 13 further comprising tuning an automatic gain control of a transmitting channel with one or more of the plurality of tunable parameters.

15. The method of any of clauses 12 to 14 further comprising tuning an equalization curve of a transmitting channel with one or more of the plurality of tunable parameters.

16. The method of any of clauses 12 to 15 wherein the calculating of the plurality of tunable parameters of the hands-free system under test occurs at the same rate as the process measures the sound generation and sound pickup characteristics of the hands-free system.

17. The method of any of clauses 12 to 16 wherein the updating a hands-free system library with the calculated plurality of tunable parameters occurs at the same rate as the process measures the sound generation and sound pickup characteristics of the hands-free system.

18. The method of any of clauses 12 to 17 wherein the act of measuring the sound generation and sound pickup characteristics of the hands-free system under test occurs in response to a software update of the hands-free tuning system.

19. The method of any of clauses 12 to 18 further comprising validating the hands-free system under test against an industry standard after the hands-free system library is updated.

20. The method of any of clauses 12 to 19 further comprising comparing the selected sound generation and sound pickup characteristics of the hands-free system under test to a predetermined threshold and generating a status signal that indicates a clipping condition, a saturation condition, an aliasing condition, a distortion condition, a noise floor condition, a latency condition or a packet dropout condition.

21. The method of any of clauses 12 to 20 wherein the acts of: playing one or more test signals, recording the responses of the hands-free tuning system; measuring the sound generation and sound pickup characteristics of the hands-free system under test; calculating the plurality of tunable parameters of the hands-free system under test; and updating the hands-free system library is a repeated until the hands-free system under test reaches an industry standard operating condition.

22. A non-transitory machine-readable medium encoded with machine-executable instructions, where execution of the machine-executable instructions:

play one or more test signals that vary in frequency and in amplitude out of a hands-free system under test or a hands-free tuning system;

record the responses of the hands-free tuning system under test or the hands-free tuning system at a microphone of the hands-free tuning system and the microphone of the hands-free system under test;

measure the sound generation and sound pickup characteristics of the hands-free tuning system under test or the hands-free tuning system with respect to the one or more of the test signals and one or more of the microphone signals;

calculate a plurality of tunable parameters; and update a hands-free system library with the calculated plurality of tunable parameters; wherein the hands-free library is remote from the hands-free tuning system.

23. The non-transitory machine-readable medium of clause 22 wherein the instructions that play one or more test signals that vary in frequency and in amplitude out of a hands-free system under test comprises injecting these signals into a telephone/network simulator.

24. The non-transitory machine-readable medium of any of clauses 22 to 23 wherein the instructions that record the responses of the hands-free tuning system under test or the hands-free tuning system at the microphone of the hands-free tuning system and the microphone of the hands-free system under test comprises recording the responses at a telephone/network simulator.

25. The non-transitory machine-readable medium of any of clauses 22 to 24 wherein the instructions further tune a multiband compressor with one or more of the plurality of tunable parameters.

26. The non-transitory machine-readable medium of any of clauses 22 to 25 wherein the instructions further tune an automatic gain control of a transmitting channel with one or more of the plurality of tunable parameters.

27. The non-transitory machine-readable medium of any of clauses 22 to 26 wherein the instructions further tune an automatic gain control of a receiving channel with one or more of the plurality of tunable parameters.

28. The non-transitory machine-readable medium of any of clauses 22 to 27 wherein the instructions further tune an equalization curve of a transmitting channel with one or more of the plurality of tunable parameters.

29. The non-transitory machine-readable medium of any of clauses 22 to 28 wherein the instructions further tune an equalization curve of a receiving channel with one or more of the plurality of tunable parameters.

30. The non-transitory machine-readable medium of any of clauses 22 to 29 wherein the instructions that calculate the plurality of tunable parameters of the hands-free system under test occurs at the same rate as the process measures the sound generation and sound pickup characteristics of the hands-free system.

31. The non-transitory machine-readable medium of any of clauses 22 to 30 wherein the instructions that update a hands-free system library with the calculated plurality of tunable parameters occurs at the same rate as the process measures the sound generation and sound pickup characteristics of the hands-free system.

32. The non-transitory machine-readable medium of any of clauses 22 to 31 wherein the instructions that measure the sound generation and sound pickup characteristics of the hands-free system under test occurs in response to a software update of the hands-free tuning system.

33. The non-transitory machine-readable medium of any of clauses 22 to 32 further comprising instructions that validate the hands-free system under test against an industry standard after the hands-free system library is updated.

34. The non-transitory machine-readable medium of any of clauses 22 to 33 further comprising instructions that compare selected sound generation and sound pickup characteristics of the hands-free system under test to a predetermined threshold and generate a status signal that indicates a clipping condition, a saturation condition, an aliasing condition, a distortion condition, a noise floor condition, a latency condition or a packet dropout condition.

35. A hands-free tuning system that automates the tuning of a hands-free system comprising:
a loudspeaker that plays one or more test signals that vary in frequency and in amplitude out of a hands-free system under test or a hands-free tuning system; a hardware audio device programmed to record the responses of a hands-free tuning system or hands-free system under test at a microphone of the hands-free tuning system and a microphone of the hands-free system under test; and
an automated tuning software module programmed to:
measure the sound generation and sound pickup characteristics of the hands-free system under test or the hands-free tuning system with respect to the one or more of the test signals and one or more of the microphone signals;
calculate a plurality of tunable parameters; and
update a hands-free system library with the calculated plurality of tunable parameters;
wherein the hands-free library is remote from the hands-free tuning system but utilized by the hands-free system under test.

36. A system that automates the tuning of a hands-free system, the system comprising:
a processor;
a memory coupled to the processor containing instructions that perform the steps of any of clauses 1 to 21.

37. A computer program stored on a computer-readable media characterized in that it comprises program code instructions for implementing the method according to any of clauses 1 to 21.

Other systems, methods, features and advantages will be, or will become, apparent to one with skill in the art upon examination of the figures and detailed description. It is intended that all such additional systems, methods, features and advantages be included within this description, be within the scope of the disclosure, and be protected by the following claims.

What is claimed is:

1. A method that automates the tuning of a hands-free system, the hands-free system having a first loudspeaker and first microphone, the method comprising:
playing one or more test signals that vary in frequency and in amplitude out of the hands-free system and out of a hands-free tuning system, the hands-free tuning system including a second microphone and second loudspeaker;
recording the responses of the hands-free tuning system to test signals emitted from the first loudspeaker at the second microphone, and recording responses of the hands-free system to test signals emitted from the second loudspeaker at the first microphone;
measuring the sound generation and sound pickup characteristics of the hands-free tuning system with respect to the one or more of the test signals and one or more of the second microphone signals, wherein measuring includes determining one or more levels of the responses at the second microphone;
measuring the sound generation and sound pickup characteristics of the hands-free system under test with respect to the one or more of the test signals and one or more of the first microphone signals, wherein measuring includes determining one or more levels of the responses at the first microphone;
calculating a plurality of tunable parameters of the hands-free system under test, wherein calculating includes comparing the one or more levels to target levels, adjusting a send automatic gain parameter based on a difference between the one or more levels and the target levels at the first microphone, and adjusting a receive automatic gain parameter based on a difference between the one or more levels and the target level at the second microphone; and
updating a hands-free system library with the calculated plurality of tunable parameters;
wherein the hands-free library is remote from the hands-free tuning system but utilized by the hands-free tuning system during operation.

2. The method of claim 1 wherein the playing of one or more test signals that vary in frequency and in amplitude out of a hands-free system comprises injecting these signals into a telephone/network simulator.

3. The method of claim 1 further comprising tuning a multiband compressor with one or more of the plurality of tunable parameters.

4. The method of claim 1 further comprising tuning an equalization curve of a receiving channel with one or more of the plurality of tunable parameters.

5. The method of claim 1 wherein the calculating of the plurality of tunable parameters of the hands-free system under test occurs at the same rate as the process measures the sound generation and sound pickup characteristics of the hands-free system.

6. The method of claim 1 further comprising comparing the selected sound generation and sound pickup characteristics of the hands-free system under test to a predetermined threshold and generating a status signal that indicates a clipping condition, a saturation condition, an aliasing condition, a distortion condition, a noise floor condition, a latency condition or a packet dropout condition.

7. A non-transitory machine-readable medium encoded with machine-executable instructions executable by a processor, where execution of the machine-executable instructions by a processor is to cause the processor to:

play one or more test signals that vary in frequency and in amplitude out of a hands-free system under test and out of a hands-free tuning system, the hands-free system having a first loudspeaker and first microphone, the hands-free tuning system including a second microphone and second loudspeaker;

record the responses of the hands-free tuning system to test signals emitted from the first loudspeaker at the second microphone and recording responses of the hands-free system to test signals emitted from the second loudspeaker at the first microphone;

measure the sound generation and sound pickup characteristics of the hands-free tuning system with respect to the one or more of the test signals and one or more of the second microphone signals, wherein measuring includes determining one or more levels of the responses at the second microphone;

measure the sound generation and sound pickup characteristics of the hands-free tuning system with respect to the one or more of the test signals and one or more of the first microphone signals, wherein measuring includes determining one or more levels of the responses at the first microphone;

calculate a plurality of tunable parameters by comparing the one or more levels to target levels, adjusting a send automatic gain parameter based on a difference between the one or more levels and the target levels at the first microphone, and adjusting a receive automatic gain parameter based on a difference between the one or more levels and the target level at the second microphone; and update a hands-free system library with the calculated plurality of tunable parameters; wherein the hands-free library is remote from the hands-free tuning system.

8. The non-transitory machine-readable medium of claim 7 wherein the instructions that play one or more test signals that vary in frequency and in amplitude out of a hands-free system comprises injecting these signals into a telephone/network simulator.

9. The non-transitory machine-readable medium of claim 7 wherein the instructions that record the responses of the hands-free tuning system or the hands-free tuning system at the second microphone of the hands-free tuning system and the first microphone of the hands-free system comprises recording the responses at a telephone/network simulator.

10. The non-transitory machine-readable medium of claim 7 wherein the instructions further tune a multiband compressor with one or more of the plurality of tunable parameters.

11. A hands-free tuning system for automatically tuning a hands-free system, the hands-free system having a first loudspeaker and first microphone, the hands-free tuning system comprising:

a second microphone;

a second loudspeaker;

a processor coupled to the second microphone and the second loudspeaker, and to the first loudspeaker and the first microphone;

a memory storing processor executable instructions that, when executed, are to cause the processor to:

play one or more test signals that vary in frequency and in amplitude out of a hands-free system under test and out of a hands-free tuning system, the hands-free system having a first loudspeaker and first microphone, the hands-free tuning system including a second microphone and second loudspeaker;

record the responses of the hands-free tuning system to test signals emitted from the first loudspeaker at the second microphone and recording responses of the hands-free system to test signals emitted from the second loudspeaker at the first microphone;

measure the sound generation and sound pickup characteristics of the hands-free tuning system with respect to the one or more of the test signals and one or more of the second microphone signals, wherein measuring includes determining one or more levels of the responses at the second microphone;

measure the sound generation and sound pickup characteristics of the hands-free tuning system with respect to the one or more of the test signals and one or more of the first microphone signals, wherein measuring includes determining one or more levels of the responses at the first microphone;

calculate a plurality of tunable parameters by comparing the one or more levels to target levels, adjusting a send automatic gain parameter based on a difference between the one or more levels and the target levels at the first microphone, and adjusting a receive automatic gain parameter based on a difference between the one or more levels and the target level at the second microphone; and update a hands-free system library with the calculated plurality of tunable parameters; wherein the hands-free library is remote from the hands-free tuning system.

12. The system claimed in claim 11, further comprising a telephone/network simulator, and wherein the processor executable instructions, when executed, are to cause the processor to play the one or more test signals by injecting them into the telephone/network simulator.

* * * * *